United States Patent [19]

Loreck et al.

[11] Patent Number: 5,638,247
[45] Date of Patent: Jun. 10, 1997

[54] CIRCUIT CONFIGURATION FOR MONITORING A PLURALITY OF COILS

[75] Inventors: Heinz Loreck, Idstein; Michael Zydek, Langgöns; Tibor Toth, Hattersheim; Alois Thöne, Friedberg, all of Germany

[73] Assignee: ITT Automotive Europe GmbH, Frankfurt, Germany

[21] Appl. No.: 454,330

[22] PCT Filed: Dec. 4, 1993

[86] PCT No.: PCT/EP93/03414

§ 371 Date: Jun. 15, 1995

§ 102(e) Date: Jun. 15, 1995

[87] PCT Pub. No.: WO94/14077

PCT Pub. Date: Jun. 23, 1994

[30] Foreign Application Priority Data

Dec. 15, 1992 [DE] Germany .......................... 42 42 177.2

[51] Int. Cl.⁶ .................................................. H01H 47/00
[52] U.S. Cl. .................................................. 361/191
[58] Field of Search ................................ 324/418, 422, 324/511; 303/122.08; 361/160, 191; 340/453

[56] References Cited

U.S. PATENT DOCUMENTS

| | | | |
|---|---|---|---|
| 3,841,712 | 10/1974 | Syria | 303/122.08 |
| 4,340,935 | 7/1982 | Anlauf et al. | 303/122.08 |
| 4,764,884 | 8/1988 | Noyori | 364/552 |
| 5,099,198 | 3/1992 | Bleckmann et al. | |
| 5,193,887 | 3/1993 | Bleckmann et al. | 303/122.07 |

FOREIGN PATENT DOCUMENTS

| | | |
|---|---|---|
| 2 122 917 | 11/1972 | Germany . |
| 2 728 355 | 12/1977 | Germany . |
| 2 701 159 | 7/1978 | Germany . |
| 3 806 649 | 9/1988 | Germany . |
| 3 810 157 | 10/1989 | Germany . |
| 3 823 182 | 1/1990 | Germany . |
| 3 939 630 | 5/1990 | Germany . |
| 3 842 169 | 6/1990 | Germany . |
| 3 925 418 | 2/1991 | Germany . |
| 4 103 310 | 8/1992 | Germany . |
| 4 112 996 | 10/1992 | Germany . |
| 61-182586 | 8/1986 | Japan . |

*Primary Examiner*—Fritz Fleming
*Attorney, Agent, or Firm*—Thomas N. Twomey; J. Gordon Lewis

[57] ABSTRACT

In a circuit configuration for monitoring a plurality of coils and the final stages for actuating these coils, the coils are connected to the supply voltage by way of a joint supply line and a joint relay. Connected to the supply line, by way of a high-ohmic resistor, is a test voltage source and a first potential monitor, by which the potential prevailing on the supply line is determined after the voltage supply has been interrupted by opening the relay contact. A second potential monitor serves to monitor the proper potential changes on activation of the voltage supply by actuating the relay.

18 Claims, 1 Drawing Sheet

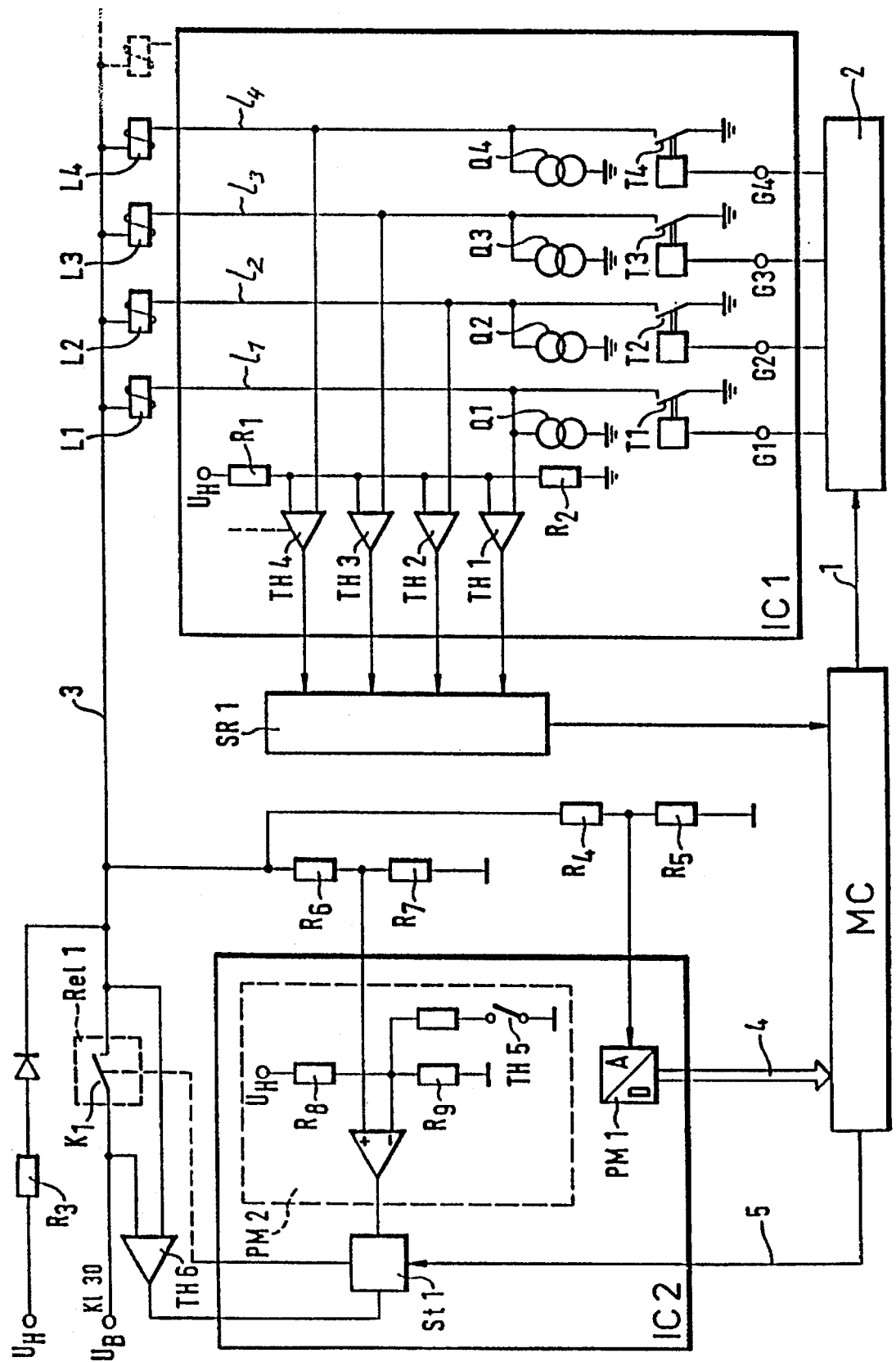

CIRCUIT CONFIGURATION FOR MONITORING A PLURALITY OF COILS

This application is the U.S. national-phase application of PCT International Application No. PCT/EP93/03414.

BACKGROUND OF THE INVENTION

The present invention relates to a circuit configuration for monitoring a plurality of coils and the final stages for actuating these coils, for example, the valve coils of a brake system with anti-lock or traction slip control. The coils are connected to the supply voltage by way of a joint supply line and a joint relay. The final stages are driven by test pulses according to a predetermined program and the potential change at the individual coil actuating connections is detected. The coils are monitored by this circuit for operability, shunts, line interruptions and other defects.

DE 39 25 418 A1 discloses a circuit configuration of this type. Short test pulses are applied to final stages, which serve to control electrically operable valves, according to a predetermined pattern, and the reaction to the test pulses is monitored. To this end, the actuating connections of the individual valves are joined by way of a comparator circuit and, in addition, an OR-linking. The comparator circuit includes a row of non-equivalence or equivalence elements. The output signals of the comparator circuit and the OR-linking are supplied to another comparator element, the output signal of which is finally assessed in response to the test pulses for monitoring the final stages.

SUMMARY OF THE INVENTION

An object of the present invention is to provide a monitoring circuit of this type which permits detection of most various errors, such as short circuits, shunts, line interruptions, as well as errors of the monitoring components themselves, with great reliability. Incurring as little expenditure as possible for this monitoring operation is desired.

It has been found that this object may be achieved by a circuit configuration of the previously mentioned type, the characteristic features of which are that the supply line is connected to a first potential monitor and, by way of a high-ohmic resistor, is connected to a test voltage source, wherein the potential prevailing on the supply line can be determined by the first potential monitor after the voltage supply has been interrupted or the relay contact has been opened.

Whether leakage currents occur and, under certain circumstances, whether the leakage currents are within or outside a tolerable range may be recognized by connecting the supply line to a test voltage source and inserting a high-ohmic resistor, interrupting the voltage supply during the testing operation by means of the relay, and measuring the potential which prevails on the supply line during this test period. Depending on the magnitude of such a leakage current, different reactions of the monitoring circuit, namely instantaneous deactivation of the control, decelerated deactivation or maintaining of the control, are expedient. Of course, short circuits between the supply line or the coil and the ground, defective final stages, failing actuation and other errors may be detected as well.

According to a favorable aspect of the present invention, a second potential monitor is connected to the supply line and, upon activation of the supply voltage, monitors the proper potential change on the supply line which is caused by operation of the relay.

Expediently, the voltage monitors are connected to the supply line by way of voltage dividers to determine voltage tolerance ranges which are still admissible for proper operation.

The use of a semiconductor relay for activating and deactivating the voltage supply for the coils is particularly advantageous because such semiconductor relays react very quickly to actuating signals. This renders it possible to perform the test program at different points of time, even during the normal operation, without impairing the proper operation of the anti-lock or traction slip control.

Expediently, an analog/digital converter is used as a first potential monitor so as to determine and assess the magnitude of potential displacements due to certain errors.

According to an embodiment of the present invention, the second potential monitor is a window comparator with a reswitchable threshold. After the supply voltage is activated by corresponding actuation of the relay and exceeding of a first threshold value, switch-over to a second threshold value takes place, this switch-over being assessed as a criterion for the proper function of the window comparator. Further, the potential change at the input of the first potential monitor may also be assessed, in response to the relay actuation, for checking the operability of the first potential monitor.

According to yet another embodiment of the present invention, during actuation of the individual final stages by the test pulses, the respective potential change on the coil actuating connections is compared with the potential changes at the input of the first potential monitor or the analog/digital converter and assessed for monitoring and for error detection.

Further features, advantages and possible applications of the present invention can be seen in the following description of one embodiment of the present invention given in connection with the accompanying drawing.

BRIEF DESCRIPTION OF THE DRAWING

The single FIGURE is a schematically simplified view of a circuit diagram which shows the most important components of a circuit configuration according to the present invention.

DETAILED DESCRIPTION OF THE INVENTION

Referring to the drawing, the illustrated circuit configuration is part of the electronic control circuit of a brake circuit with anti-lock or traction slip control. The braking pressure in such brake systems is controlled by way of electrically or electromagnetically operable hydraulic valves, the coils of which are represented by L1 to L4 in the drawing. Dotted lines show that, in general, more valves and, thus, also valve coils (for example 8 or 10) can be provided.

Final stages for activating and deactivating the energizing current for the coils L1 to L4 are represented by switches or transistors T1 to T4 which are driven and, thus, operated by way of the connections G1 to G4. Comparators TH1 to TH4 provide indications of whether the potential at the output of the switches or transistors T1 to T4 or the actuating connection $l_1$ to $l_4$ of the coils L1 to L4 is above or below a predetermined threshold value which is defined by means of a reference voltage $U_H$ and a voltage divider $R_1$, $R_2$. When switches T1 to T4 are open, the potential is determined at the corresponding input of the comparators TH1 to TH4 by a high-ohmic pre-resistor or by current sources Q1 to Q4.

The switches T1 to T4, the comparators TH1 to TH4, the voltage divider $R_1$, $R_2$ and the current sources Q1 to Q4, appropriately, are accommodated in one joint integrated circuit IC1.

The output levels of the comparators TH1 to TH4 are ascertained by way of a shift register SR1 and transferred serially to a microcontroller MC. Correspondingly, the test pulses are supplied from the microcontroller MC, via a line 1 and a converter 2, to the control connections G1 to G4 of the switches T1 to T4. The solenoid valves or the coils L1 to L4 are connected to the electric energy source, that is a battery with the voltage $U_B$, by way of a joint supply line 3 and a relay Rel 1.

In addition, a reference voltage source or test voltage source with the voltage $U_H$ is connected to the supply line 3 through a high-ohmic resistor $R_3$, 'high-ohmic' meaning in comparison with the internal resistance of the source $U_B$.

The potential on the supply line 3 in the illustrated circuit configuration according to the present invention is determined and monitored by means of two potential monitors PM1 and PM2 which are connected to the supply line 3 by way of voltage dividers $R_4$, $R_5$ or $R_6$, $R_7$.

The first potential monitor PM1 is provided as an analog/digital converter in the embodiment of the present invention being described. The potential variation at the input of the converter PM1 is converted sensitively into digital output signals which are supplied through a multiple line 4 to the microcontroller MC for assessment.

The second potential monitor PM2 is provided in the form of a window comparator with a re-switchable threshold. A switch TH5 serves for the threshold switch-over. Finally, the output signal of the window comparator PM2 is converted in a control unit St1 into a signal for actuation of the semiconductor relay Rel 1. An output of the microcontroller MC leads through a line 5 to the control unit St1 to enable the microcontroller MC, by way of the control unit St1, to actuate the relay Rel 1 upon detection of a defect or an error function, and to thereby interrupt the current supply to the coils L1 to L4.

The purpose of another comparator TH6 is to detect the operating condition or the operating position of the relay Rel 1.

The illustrated monitoring circuit configuration according to the present invention operates as follows:

Relay Rel 1 functions as the so-called main relay. Initially, a contact $K_1$ of relay Rel 1 is closed when the ignition is started. With an electronic relay, the contact is made by the controllable internal resistance of a semiconductor element. This is monitored by the window comparator or the second potential monitor PM2.

With the relay contact $K_1$ open, the potential at the input of the window comparator PM2 is "low". The test or reference voltage $U_H$ is considerably lower than the battery voltage $U_B$ so that the influence of the voltage source $U_H$ on the voltage at the input of the monitor PM2 or on the voltage divider $R_6$, $R_7$ is negligible. If $K_1$ is closed from the beginning (because there is a short circuit), this is detected at once.

After the relay contact $K_1$ is closed, the voltage at the input of the window comparator PM2 rises in excess of the threshold voltage, which is predetermined by the voltage $U_H$ and the resistors $R_8$ and $R_9$, at the second input of the comparator. The output of the comparator is switched to "high." After this has occurred, the threshold of this window comparator is set to a higher value by way of the switch TH5 so that the output of the comparator becomes "low" again. Due to these low-high-low changes, in addition, the function of the window comparator PM2 is tested, with the semiconductor relay Rel 1 duly operating. After switch-over to the higher threshold, the window comparator, by way of the control unit St1, serves to activate or deactivate the relay Rel 1 and, thus, the controller upon the occurrence of overvoltages at the $U_B$ input terminal KL30.

The activation of the valve coils L1 to L4 is checked by means of test pulses which are supplied by the microcontroller MC through line 1. These test pulses are so short that the hydraulic valves, incorporating the valve coils L1 to L4, do not respond. However, the respective switch T1 to T4 is closed by these test pulses, and, thus, a potential change is caused at the input of the corresponding comparator TH1 to TH4 and the actuating connections $l_1$ to $l_4$. In addition, the contact $K_1$ of the semiconductor relay Rel 1 is opened by the test pulses.

If none of the hydraulic valves or none of the coils L1 to L4 is actuated, with contact $K_1$ of the relay Rel 1 open, a potential must prevail at the input of the analog/digital converter PM1, the magnitude of which depends on the reference voltage or test voltage $U_H$ and the resistors $R_3$, $R_4$, $R_5$, $R_6$ and $R_7$. A short-circuit or a leakage current from the supply line 3 to ground would change the potential at the input of the analog/digital converter PM1. The magnitude of the potential at the input of the converter PM1 permits conclusions with respect to the magnitude of a possible leakage current. A small leakage current would certainly be tolerable for a long time or temporarily, while a greater leakage current would induce a grave error and, thus, would require, as a consequence, deactivation of the control by actuating the relay Rel 1 or opening the contact $K_1$.

By corresponding actuation of the individual final stages or switches T1 to T4 and assessment of the potential changes at the inputs of the comparators TH1 to TH4 and at the input of the first voltage monitor or analog/digital converter PM1, which changes occur in response to the actuation of these switches, indications of the location or the source of potential errors are developed. Actuation by way of test pulses according to a specific program, of course, permits detection of the failure of a stage, for example, a switch T1 to T4 or a comparator TH1 to TH4, the shift register SR1 or the potential monitor PM1. Thus, not only the valve coils L1 to L4 but also the monitoring circuit are tested automatically for operability.

A defined bias voltage or threshold voltage is preset for the comparators TH1 to TH4 by way of the reference voltage $U_H$ and the voltage divider $R_1$, $R_2$. In addition, the current sources Q1 to Q4 set a certain minimum value at the corresponding comparator inputs, with switches T1 to T4 open. When the threshold, predefined by the reference voltage $U_H$, is not reached, this indicates a short circuit to ground. This condition is detected as well and assessed in the microcontroller MC for deactivation of the control.

In this embodiment, the circuit configuration according to the present invention is shown by way of a brake system with electronic control. However, similarly, the coils of other electromechanical systems, for example, the injection systems of a vehicle, may also be monitored. As can be seen in the preceding explanations, a plurality of very different types of errors, including defective monitoring components, are detected.

We claim:

1. A circuit configuration for monitoring a plurality of coils and the final stages for actuating these coils, wherein the coils are connected to the supply voltage by way of a joint supply line and a joint relay, and wherein the final stages are driven by test pulses according to a predetermined program and the potential changes at the individual coil actuating connections are detected, characterized in that the supply line is connected to a first potential monitor and, by way of a high-ohmic resistor, is connected to a test voltage source and wherein the potential prevailing on the supply line can be determined by the first potential monitor after the voltage supply has been interrupted or the relay or the relay contact, has been opened.

2. A circuit configuration as claimed in claim 1, characterized in that a second potential monitor is connected to the supply line and, upon activation of the supply voltage, monitors the proper potential change on the supply line which is due to the operation of the relay.

3. A circuit configuration as claimed in claim 2, characterized in that the voltage monitors are connected to the supply line by way of voltage dividers.

4. A circuit configuration as claimed in claim 3, characterized in that a semiconductor relay is provided as relay for activating and deactivating the supply voltage.

5. A circuit configuration as claimed in claim 4, characterized in that an analog/digital converter is provided as a first potential monitor.

6. A circuit configuration as claimed in claim 5, characterized in that, as a second potential monitor, a window comparator with a reswitchable threshold is provided, the switch-over to a second threshold value taking place after the supply voltage is activated and a first threshold value is exceeded, the switch-over being assessed as a criterion for the proper function of the window comparator.

7. A circuit configuration as claimed in claim 5, characterized in that the potential change at the input of the first potential monitor is assessed, in response to the actuation of the relay, for checking the operability of the first potential monitor.

8. A circuit configuration as claimed in claim 2, characterized in that, during actuation of the individual final stages by the test pulses, the respective potential change at the coil actuating connections is compared with the potential changes at the input of the first potential monitor and assessed for monitoring and/or error detection.

9. A circuit configuration as claimed in claim 3, characterized in that the coils are the valve coils of a controlled brake system.

10. A circuit configuration for monitoring a plurality of coils and final stages which actuate the coils and are connected by individual coil actuating connections to the coils, said circuit configuration comprising:

a supply voltage;

a joint supply line and a relay contact of a joint relay for connecting the coils to said supply voltage;

means for driving the final stages with test pulses according to a predetermined program;

a first potential monitor connected to said supply line for determining the potential prevailing on said supply line after said relay contact has been opened;

a high-ohmic resistor for connecting said supply line to said test source; and means for detecting the potential changes at the individual coil actuating connections.

11. A circuit configuration according to claim 10 further including a second potential monitor connected to said supply line for monitoring the proper potential change on said supply line which is due to operation of the relay upon activation of said supply voltage.

12. A circuit configuration according to claim 11 wherein said means for detecting the potential changes at the individual coil actuating connections include:

(a) means for comparing potential changes at the coil actuating connections with potential changes at the input of the first potential monitor during actuation of the individual final stages by the test pulses, and (b) means for assessing potential changes at the coil actuating connections during actuation of the individual final stages by the test pulses for monitoring and detecting errors.

13. A circuit configuration according to claim 12 wherein the coils are valve coils of a controlled brake system.

14. A circuit configuration according to claim 13 further including:

(a) a first voltage divider for connecting said first potential monitor to said supply line, and (b) a second voltage divider for connecting said first potential monitor to said supply line.

15. A circuit configuration according to claim 14 wherein said joint relay is a semiconductor relay.

16. A circuit configuration according to claim 15 wherein said first potential monitor is an A/D converter.

17. A circuit configuration according to claim 16 wherein said second potential monitor is a window comparator having a reswitchable threshold with:

(a) switch-over to a second threshold value occurring after said relay contact of said joint relay is closed to connect said supply voltage to said supply line and a first threshold value is exceeded, and (b) the switch-over is assessed as a criterion for proper operation of said window comparator.

18. A circuit configuration according to claim 17 wherein potential changes at the input of said first potential monitor are assessed, in response to actuation of said joint relay to check operation of said first potential monitor.

* * * * *